United States Patent [19]
Hightower et al.

[11] Patent Number: 5,332,963
[45] Date of Patent: Jul. 26, 1994

[54] HIGH INPUT IMPEDANCE BUFFER WITH LOW FEEDBACK RESISTANCE

[75] Inventors: Marshall L. Hightower, Mountlake Terrace; James F. Allen, Seattle, both of Wash.

[73] Assignee: John Fluke Mfg. Co., Inc., Everett, Wash.

[21] Appl. No.: 77,970

[22] Filed: Jun. 15, 1993

Related U.S. Application Data

[63] Continuation of Ser. No. 861,348, Mar. 30, 1992, abandoned, which is a continuation of Ser. No. 746,851, Aug. 19, 1991, abandoned, which is a continuation of Ser. No. 480,223, Feb. 15, 1990, abandoned.

[51] Int. Cl.$^5$ ........................ G01R 1/30; G01R 15/08
[52] U.S. Cl. ................................. 324/123 R; 324/115
[58] Field of Search ............... 324/115, 123 R, 123 C, 324/99 R, 99 D, 121 R; 330/75, 86, 108, 282, 293

[56] References Cited

U.S. PATENT DOCUMENTS

| | | | |
|---|---|---|---|
| 3,524,135 | 8/1970 | Nercessian | 324/123 R |
| 3,778,710 | 12/1973 | Snook | 324/123 R |
| 3,836,852 | 9/1974 | Ross | 324/115 |

*Primary Examiner*—Ernest F. Karlsen
*Attorney, Agent, or Firm*—Richard A. Koske

[57] ABSTRACT

A high input impedance AC buffer for use in an instrument that does not require high frequency compensation or calibration. An op-amp receives an input signal that is to be measured via a high resistance input resistor and produces an output signal proportional to the input signal. A feedback resistor block and a feedback attenuator form the feedback path of the buffer and establish buffer gain. The low resistances of the feedback block and the feedback attenuator are substantially less than the resistance of the high resistance input resistor, precluding the need for compensation and calibration capacitors. A switching circuit operates to select resistors in the feedback resistance block and the feedback attenuator to provide predetermined gains for the buffer.

6 Claims, 2 Drawing Sheets

HIGH INPUT IMPEDANCE BUFFER WITH LOW FEEDBACK RESISTANCE This application is a continuation of prior U.S. application Ser. No. 07/861,348, filed on Mar. 30, 1992, now abandoned, which is a continuation of U.S. application Ser. No. 07/746,851, filed on Aug. 19, 1991, now abandoned, which is a continuation of U.S. application Ser. No. 07/480,223, filed on Feb. 15, 1990, now abandoned.

FIELD OF THE INVENTION

This invention relates generally to AC buffers and, more particularly, to wide bandwidth, high input impedance operational buffers.

BACKGROUND OF THE INVENTION

An instrument used for measuring AC electric signals typically has a high impedance front end that substantially isolates the instrument from the circuit containing the signal being measured. The isolation allows the instrument to make an accurate measurement without significantly disturbing the signal being measured. Conversely, if the instrument were to have a low impedance front end, the instrument would not be isolated from the circuit and the signal being measured would be loaded down by components in the instrument, thereby resulting in an inaccurate measurement of the signal.

In many instances, the front end these instruments includes a high input impedance AC buffer, which consists, in part, of an operational amplifier. If the instrument is intended to measure a broad range of signal magnitudes, the front end will undoubtedly have a range selection capability. The range selection capability in prior art instruments is provided by resistors selectably connected in series with the input signal path ahead of the operational amplifier or in the feedback path of the buffer. When connected in the signal path, the selected resistor(s) scales the signal magnitude as required by the instrument. When connected in the feedback path, the selected resistor(s) determine the gain of the buffer. Traditionally, resistors having high resistance values have been used in high input impedance AC buffers for both signal scaling and feedback gain control. The high resistance of the input resistors provides the high impedance characteristic of these AC buffers.

As is well known by one having ordinary skill in the amplifier art, the gain of the buffer must remain substantially constant for all frequencies of input signals that are to be accurately measured. A signal whose frequency lies in that portion of the buffer's bandwidth in which the gain is not constant, that is, where the buffer gain is changing, will not be accurately measured by the instrument. Unfortunately, the combination of the high resistance of the prior art input and feedback resistors and the stray capacitance associated with the buffers cause the gain of the buffer to vary. Typically this gain variation occurs for signal frequencies in the upper end of the bandwidth of the buffer. To correct this problem, prior art instruments must be compensated so as to be calibrated at these high signal frequencies.

Historically, calibration of prior art instruments has been accomplished by inserting compensation capacitors in the buffer circuit. In effect, these capacitors reduce the effects of stray capacitance of the buffer. The compensation capacitors may include adjustable type capacitors. Depending on the sophistication of the instrument, the calibration procedure may be performed manually or automatically. When performed manually, a trained technician removes the instrument cover and adjusts the capacitors until the instrument falls within the manufacture's specifications. Such a procedure can be rather time consuming. If the instrument is of the type that is calibrated automatically, the procedure is typically performed by a calibration program embedded in the instrument. The program instructs switches to open and close so that fixed compensation capacitors are connected to the buffer circuit in a predetermined manner. Obviously, the complexity of the calibration program increases as the number of capacitors and switching operations increase.

As is readily apparent from the foregoing discussion, manual calibration of prior art signal measuring instruments is time consuming and, therefore expensive, while automatic calibration procedures add to the complexity and expense of the instruments. Furthermore, the compensation capacitors used in prior art instruments increase the manufacturing cost of the instrument. Yet another problem caused by the use of compensation capacitors is the corresponding increase in the number of components, which hampers efforts to reduce the size of the instrument.

Accordingly, there is a need for a high input impedance AC buffer suitable for use in an instrument that does not require calibration at high signal frequencies. The buffer should have as few parts as possible so that it is compact and inexpensive to manufacture. The present invention is directed to an input buffer having lower feedback resistance designed to achieve these results.

SUMMARY OF THE INVENTION

In accordance with this invention, a high input impedance AC buffer that does not require high frequency compensation or calibration within the measurement frequency range is provided. The buffer includes a high resistance input resistor for isolating the buffer from a circuit containing the signal to be measured, an operational amplifier whose highest specified frequency is substantially greater than the highest frequency of the signals that are to accurately measured, and a feedback resistor block and feedback attenuator in the feedback path of the buffer. The buffer has a variable gain determined, in part, by a selected combination of feedback resistors in the feedback block and feedback resistors in the feedback attenuator. A switching circuit is operable to selectively couple the feedback resistor block and the feedback attenuator to the feedback path to provide appropriate buffer gain. The feedback resistor block operates to provide a first predetermined buffer gain and the feedback attenuator increases the first predetermined buffer gain to a second predetermined gain. The increased gain provided by the feedback attenuator allows the values of the resistors in the feedback resistor block to be substantially smaller than the resistance of the input resistor. The resistor values of the feedback attenuator are at least as low as the values of the resistors in the feedback resistor block.

In accordance with further aspects of the present invention, the switching circuit includes a plurality of switches for selectively coupling at least one of a plurality of feedback resistors in the feedback resistor block and the feedback attenuator to the feedback path of the buffer.

In accordance with alternative aspects of the present invention, the operational amplifier is a decompensated operational amplifier that is not frequency compensated for closed loop stability at its highest specified frequency. The highest specified frequency is substantially higher than the highest frequency of interest for input signals that are to be measured accurately.

As will be readily appreciated from the foregoing summary, the present invention provides a high input impedance AC buffer having low feedback resistances whose values preclude compensation and calibration of the buffer at high input signal frequencies.

BRIEF DESCRIPTION OF THE DRAWINGS

The foregoing and other advantages of this invention will become more readily appreciated as the same becomes better understood by reference to the following detailed description taken in conjunction with the accompanying drawings, wherein.

DESCRIPTION OF THE PREFERRED EMBODIMENT

Figure 1:
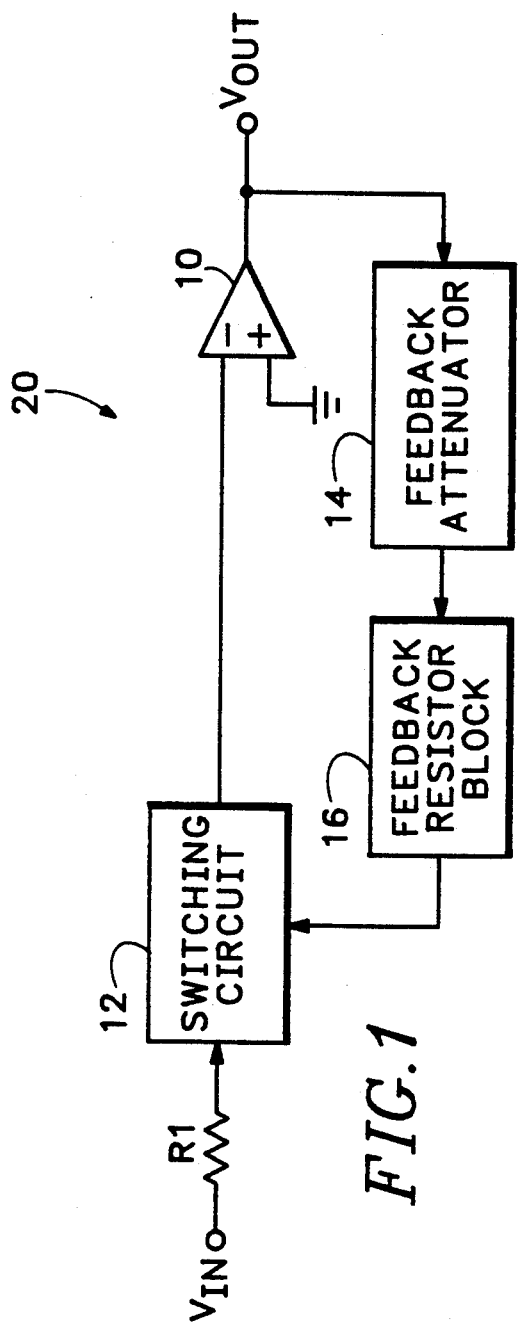
FIG. 1 is a simplified block diagram of a high input impedance AC buffer formed in accordance with the present invention.

FIG. 1 illustrates, in block diagram form, the front end of an instrument used to measure AC signals. The front end, which is formed in accordance with the present invention, is essentially a high input impedance AC buffer 20 comprising: a high input resistance, shown figuratively as a resistor, denoted R1; an operational amplifier (hereinafter op-amp) 10; a switching circuit 12; a feedback attenuator 14; and a feedback resistor block 16. An AC electric signal, $V_{IN}$, which is to be measured, is applied to an input of the switching circuit 12 via R1, where R1 provides isolation between the instrument and the circuit containing the $V_{IN}$ signal. The output of the switching circuit 12 is applied to the inverting input of the op-amp 10. The non-inverting input is grounded. An output signal, $V_{OUT}$ is produced at the output of the op-amp 10 and is proportional to $V_{IN}$. The feedback attenuator 14 and the feedback resistor block 16 are connected in the feedback path of the buffer 20. That is, $V_{OUT}$ is applied to the feedback attenuator 14, whose output is applied to the feedback block 16, which in turn is connected to the switching circuit 12 where it is combined with $V_{IN}$ to form the input to the op-amp 10, thereby establishing the feedback of the buffer 20. The high resistance of the input resistor, R1, and the resistances of the feedback attenuator 14 and the feedback resistor block 16 determine the gain of the buffer 20. In accordance with the present invention, the feedback attenuator 14 provides buffer gain to make up for gain attenuation due to low resistance values of the feedback resistor block 16. This leads to an important feature of the present invention, namely that the feedback resistor block 16 of the present invention has lower resistance values than the resistance values of the feedback resistors in prior art AC buffers. The use of low value resistors in the feedback resistor block 16 is made possible by the gain contribution of the feedback attenuator 14. In addition to contributing gain, the feedback attenuator 14 (like the feedback resistor block 16) has low resistance. Thus, it is possible to obtain a desired gain (such as 1.0) for the buffer 20 by using lower resistance in the buffer feedback path than was possible in prior art buffers. As a result, variations in the buffer gain caused by the combination of low feedback resistances and stray capacitance of the buffer 20 occur at substantially higher frequencies. In particular, the variations in gain occur at frequencies beyond (i.e., above) the range of frequencies of signals to be measured. Accordingly, the high input impedance buffer 20 does not require high frequency compensation or adjustment to accurately measure $V_{IN}$ signals in the entire frequency range of interest.

However, the additional gain provided by the feedback attenuator 14 is obtained at the expense of bandwidth. That is, the feedback attenuator 14, and the buffer gain it provides, reduces the bandwidth of the buffer 20. Accordingly, the op-amp 10 must have sufficient bandwidth so that the reduction in bandwidth caused by the feedback attenuator 14 allows signals in the frequency range of interest to be measured accurately. For example, if the $V_{IN}$ signal frequency range of interest is 0-100 kHz, a 100 kHz buffer having a 10 MHz op-amp might be used. The 10 MHz bandwidth of the op-amp is required because of the drop in bandwidth caused by the feedback attenuator 14. One example of an amplifier suitable for use as the op-amp 10 in the buffer 20 is a conventional, frequency compensated, op-amp such as the Model No. OP-42 op-amp, manufactured by Precision Monolithics Inc., in Santa Clara, California.

Alternatively, the op-amp 10 could be a decompensated op-amp, such as the Model No. LF-157 op-amp, manufactured by National Semiconductor, in Santa Clara, California. As commonly understood, and as intended herein, a decompensated op-amp is an op-amp that is not frequency compensated for closed loop stability at its highest specified frequency, unlike a conventional or frequency compensated op-amp. However, as noted above, a decompensated op-amp can be used as the op-amp 10 in the buffer 20 illustrated in FIG. 1, as long as the frequency range of signals to be measured is sufficiently below the highest specified frequency of the op-amp 10 and if the op-amp has sufficient gain to be used with the feedback attenuator 14. One benefit of using decompensated op-amps is that they are less expensive than conventional, frequency compensated op-amps.

Figure 2:
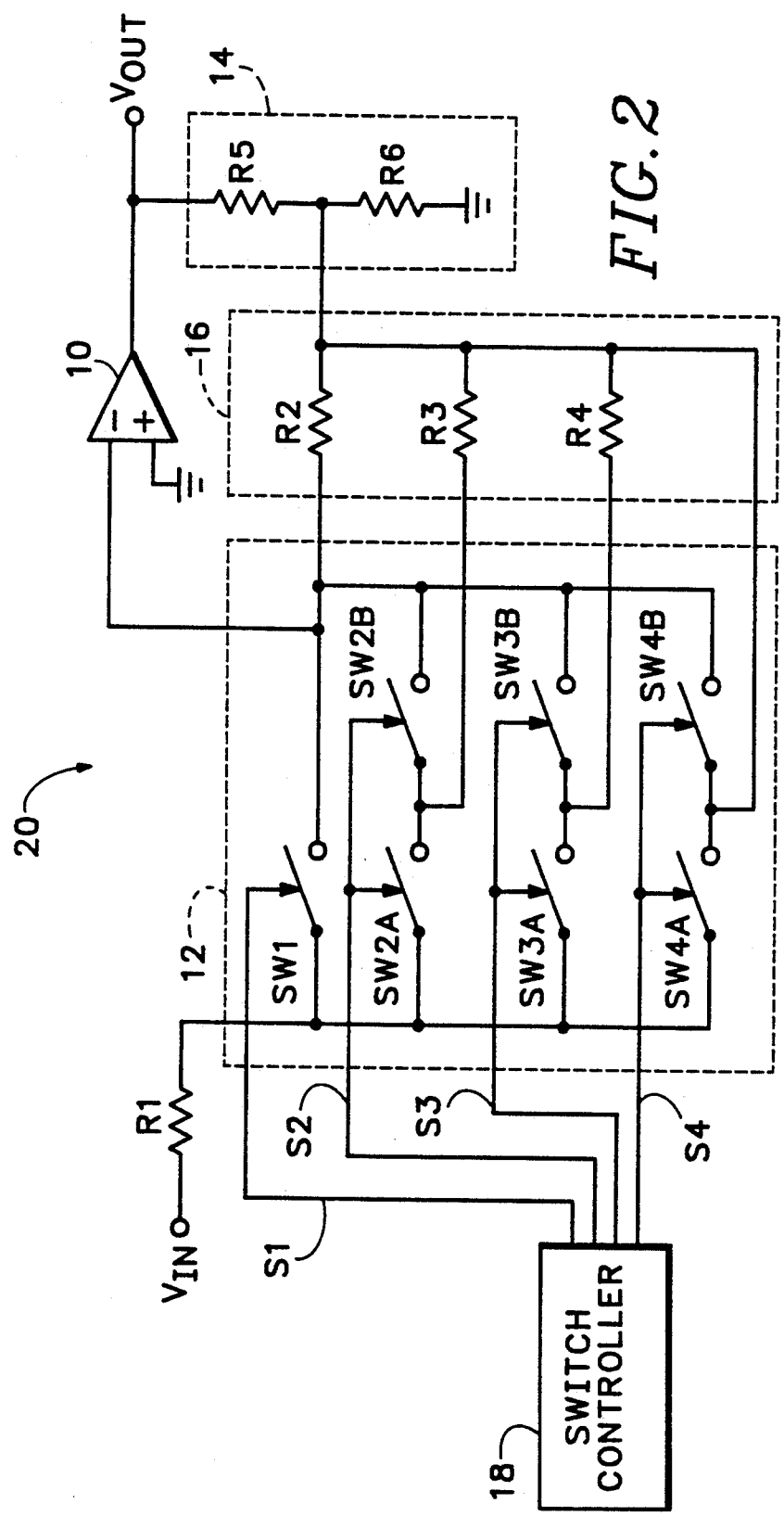
FIG. 2 is a schematic diagram of a preferred embodiment of the present invention depicted in FIG. 1.

Turning next to FIG. 2, there is depicted a schematic diagram of a preferred embodiment of the high input impedance buffer 20 discussed above and illustrated by the simplified block diagram of FIG. 1. Like signals and components depicted in FIGS. 1 and 2 are represented by like reference labels and numerals.

In accordance with one commercial embodiment of the invention, the buffer 20 is used with an instrument that has four ranges in which it can measure and display the value of the $V_{IN}$ signal. In accordance with this embodiment, the instrument has selectable ranges of 1.0, 0.1, 0.01, and 0.001 times the full scale reading of the instrument. In this particular embodiment the switching circuit 12 and the feedback resistor block 16 include a number of switches and resistors, respectively, to provide four different gains for the buffer 20 that correspond to the four different ranges of the instrument. That is, the buffer 20 has selectable gains of 1.0, 0.1, 0.01, and 0.001. It is to be understood that the commercial embodiment of the present invention discussed below and illustrated in FIG. 2, is merely illustrative, not exclusive, of ways in which the present invention may be practiced.

As depicted in FIG. 2, the switching circuit 12 comprises seven switches, denoted SW1, SW2A and SW2B, SW3A and SW3B, and, SW4A and SW4B. In the commercial embodiment of the invention noted above, SW1-SW4B are field effect transistors (FET's). The feedback resistor block 16 comprises three resistors, denoted R2, R3, and R4. As will become better understood from the following discussion, the seven switches, SW1-SW4B, operate to combine the three resistors, R2-R4, in a predetermined manner so that four different gain levels for the buffer 20 are produced. As further depicted in FIG. 2, the feedback attenuator 14 is a voltage divider comprising two resistors, denoted R5 and R6. The various components of the buffer 20 noted above are connected in the manner discussed next.

The $V_{IN}$ signal is applied, via R1, to one end of switches SW1, SW2A, SW3A, and SW4A. The other end of SW2A is connected to one end of SW2B and to one end of R3. The other end of SW3A is connected to one end of SW3B and to one end of R4. The other end of SW4A is connected to one end of SW4B, to one end of R2, to the other ends of R3 and R4, and to one end of R5 and R6. The other end of each of SW1, SW2B, SW3B, and SW4B are connected to the other end of R2 and to the inverting input of the op-amp 10. The non-inverting input of the op-amp 10 is connected to ground. The $V_{OUT}$ signal is formed at the output of the op-amp 10, which is connected to the other end of R5. The other end of R6 is connected to ground.

The switches (SW1-SW4B) are controlled by signals, denoted S1, S2, S3, and S4, respectively. The switch control signals, S1-S4, are produced by a switch controller 18. The switch controller selectively applies one of the control signals, S1, S2, S3, or S4, to the appropriate switch or switches. In accordance with the commercial embodiment of the input buffer 20 noted above, the switch controller 18 can be manually operated or operated automatically by, for example, a general purpose computer or dedicated controller. In any event, the switch controller 18, is well known in the electronic art and does not form a part of the present invention. The operation of the buffer 20 is best described by way of an example, which is presented next.

The operation of the switching circuit 12 is as follows: when a given range is selected, one or more of switches, SW1-SW4B, operate to connect one or more of resistors, R2-R4, so that the gain of the buffer 20 corresponds appropriately to the selected range of the instrument. The four control signals, S1-S4, directly correspond to the aforementioned gains of the buffer 20. That is, S1 corresponds to a gain of 1.0, S2 corresponds to a gain of 0.1, etc. Approximate values for R1-R6 in the present example are 1 MΩ, 100 kΩ, 11 kΩ, 1 kΩ, 1000Ω, and 110Ω, respectively.

For purposes of the present example, it is assumed that the switches, SW1 ∝ SW4B, are initially open. When a first range (corresponding to a gain of 1.0) is selected, the S1 signal is applied to SW1, causing SW1 to close, while SW2A-SW4B remain open. This connects R1 to the input of the op-amp 10 and places R2 in the feedback path. In this example, R2 provides a buffer gain of 0.01 (the ratio of R2 to R1). However, R5 and R6 of the feedback attenuator 14, increase the gain of the buffer 20 (in this example, by a factor of ten). Thus, when the first range is selected, the overall gain of the buffer is 1.0. When a second range (corresponding to a gain of 0.1) is selected, the S2 signal is applied to SW2A and SW2B, causing both SW2A and SW2B to close, while SW1 and SW3A-SW4B are open. This places the parallel combination of R2 and R3 in the feedback path.

The R2 and R3 combination provides a buffer gain of 0.01. R5 and R6 of the feedback attenuator 14 increase the gain by a factor of ten, resulting in an overall buffer gain of 0.1. When a third range (corresponding to a gain or 0.01) is selected, S3 is applied to SW3A and SW3B, causing both SW3A and SW3B to close while the other switches (SW1, SW2A, SW2B, SW4A and SW4B) are open. This selection places the parallel combination of R2 and R4 in the feedback path. The R2 and R4 combination provides a buffer gain of 0.001. R5 and R6 of the feedback attenuator 14 increases the gain by a factor of ten, resulting in an overall buffer gain of 0.01. Finally if the fourth range (corresponding to a gain of 0.001) is selected, the S4 signal is applied to SW4A and SW4B, causing both SW4A and SW4B to close while switches SW1-SW3B are open. This selection shorts out R2 and places just R5 in the feedback path, resulting in an overall buffer gain of 0.001 for the buffer 20.

The feedback attenuator 14 provides gain in the buffer 20 and, thereby permits the use of lower value resistors for R2, R3, and R4 in the feedback resistor block 16. The values of R5 and R6 of the feedback attenuator 14 are at least as low as the values of R2-R4. Accordingly, the required buffer gain is achieved with low value feedback resistors (R2-R6). Further, the values of R2-R6 are low enough to avoid errors due to stray capacity. Because of the low values of feedback resistance, the buffer 20 does not require compensation or calibration at high $V_{IN}$ signal frequencies. Rather, the effects of the feedback resistance and stray capacitance of the buffer 20 affect the gain of the buffer 20 outside the frequency range of interest (i.e., above 100 kHz in the above example).

While a preferred embodiment of the present invention has been illustrated and described by way of example, it is to be understood that various changes can be made therein without departing from the spirit and scope of the invention. For example, the input buffer can operate with different gains corresponding to different signal ranges. Accordingly, there may be a greater or fewer number of switches than discussed in connection with the commercial embodiment. Further, the switches could be discrete electro-mechanical switches, instead of FET's. Consequently, the invention can be practiced otherwise than as specifically described herein.

The embodiments of the invention of which an exclusive property or privilege is claimed are defined as follows:

We claim:

1. A high impedance, high frequency input circuit for an instrument suitable for measuring ac signals whose frequencies are within a predetermined frequency range, comprising:

(a) an input terminal for receiving the ac electric signals that are to be measured and an output terminal;

(b) an input resistor having a first end coupled to said input terminal;

(c) an operational amplifier having an amplifier input coupled to a second end of said input resistor and an amplifier output coupled to said output terminal; and, (d) a feedback path coupled from said amplifier output to said amplifier input, said feedback path having a first resistor and a voltage divider, wherein said input resistor, first resistor and voltage divider determine the gain for said input circuit and both the resistance of said first resistor and the total resistance of said voltage divider are significantly less than the resistance of said input resistor such that when said ac electric signals are within said predetermined frequency range said gain of said input circuit is unaffected by stray capacitance associated with said first resistor and voltage divider.

2. An input circuit according to claim 1, wherein said voltage divider comprises two series connected resistors having a first end coupled to said amplifier output and a second end coupled to ground, and further having the common junction of said series connected resistors coupled to one end of said first resistor, the other end of said first resistor being coupled to said amplifier input, wherein the resistance of each of said series connected resistors is significantly less than the resistance of said input resistor.

3. An input circuit according to claim 2, wherein the resistance of said input resistor is at least approximately ten times the resistance of said first resistor.

4. An input circuit according to claim 3, wherein the resistance of said input resistor is at least approximately 1000 times the resistance of each of said two series connected resistors of said voltage divider.

5. An input circuit according to claim 4, wherein said operational amplifier is a decompensated operational amplifier.

6. An input circuit according to claim 1, wherein said feedback path further comprises:
  (a) a second resistor having a resistance that is less than the resistance of said input resistor; and
  (b) switching means for switchably coupling said second resistor in parallel with said first resistor so as to change the gain of said input circuit.

* * * * *